United States Patent

Shibagaki et al.

[11] Patent Number: 4,733,398
[45] Date of Patent: Mar. 22, 1988

[54] APPARATUS FOR STABILIZING THE OPTICAL OUTPUT POWER OF A SEMICONDUCTOR LASER

[75] Inventors: Taro Shibagaki, Tokyo; Osamu Kinoshita, Kawasaki, both of Japan

[73] Assignee: Kabushiki Kaisha Tohsiba, Kawasaki, Japan

[21] Appl. No.: 913,751

[22] Filed: Sep. 30, 1986

[30] Foreign Application Priority Data

Sep. 30, 1985 [JP] Japan ................. 60-216569
Jan. 27, 1986 [JP] Japan ................. 61-14943

[51] Int. Cl.⁴ .............................................. H01S 3/13
[52] U.S. Cl. .................................. 372/31; 372/26; 372/38; 250/205
[58] Field of Search .................. 372/29, 31, 33, 34, 372/38, 46, 26; 250/205

[56] References Cited

U.S. PATENT DOCUMENTS 4,450,564  4/1984  Meuleman et al. ............ 372/26
4,631,728 12/1986  Simons ......................... 372/38
4,689,795  8/1987  Yoshimoto et al. ........... 372/31
4,692,606  9/1987  Sakai et al. ................... 250/205

FOREIGN PATENT DOCUMENTS 55-83280   6/1980  Japan.
57-164589 10/1982  Japan.
59-22425   5/1984  Japan.

Primary Examiner—James W. Davie
Assistant Examiner—B. Randolph
Attorney, Agent, or Firm—Oblon, Fisher, Spivak, McClelland & Maier

[57] ABSTRACT

A drive circuit supplies a semiconductor laser with current pulses corresponding to an input pulse signal. A current supply feeds a d.c. bias current to the laser. A monitoring photodiode produces a light detection signal indicative of the actual laser output level. The detection signal is supplied to a subtraction device, to which the pulse signal is also supplied via a low-pass filter. The subtraction device detects the difference between the two signals to produce an error signal. Integration devices produce average value signals, which are compared by comparators with reference voltages to obtain control signals. The current supply and the current drive circuit are responsive to these control signals to independently modulate the d.c. bias current and the amplitude of the drive pulses applied to the laser, whereby the laser output level can be stabilized to remain at a constant level.

20 Claims, 49 Drawing Figures

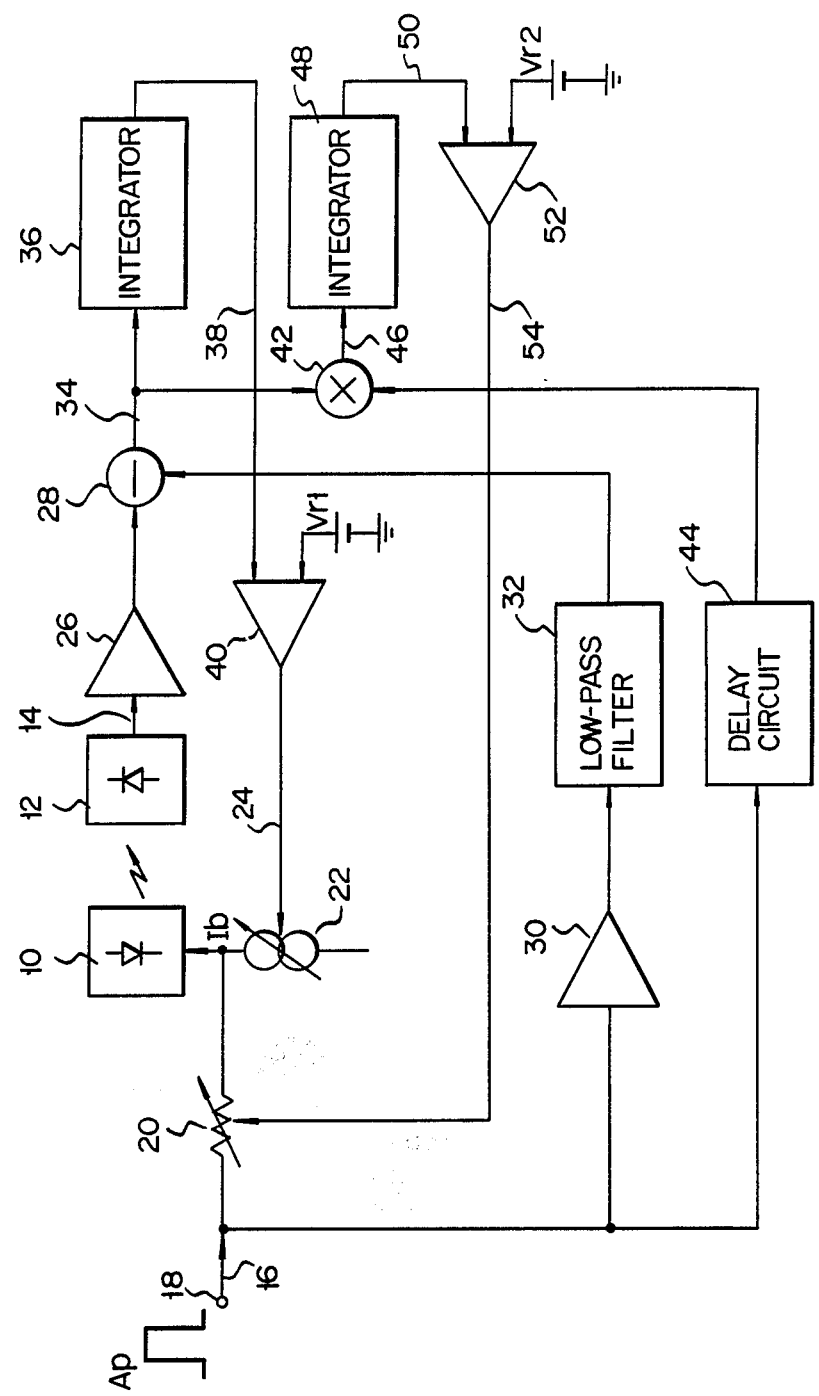
F I G. 1

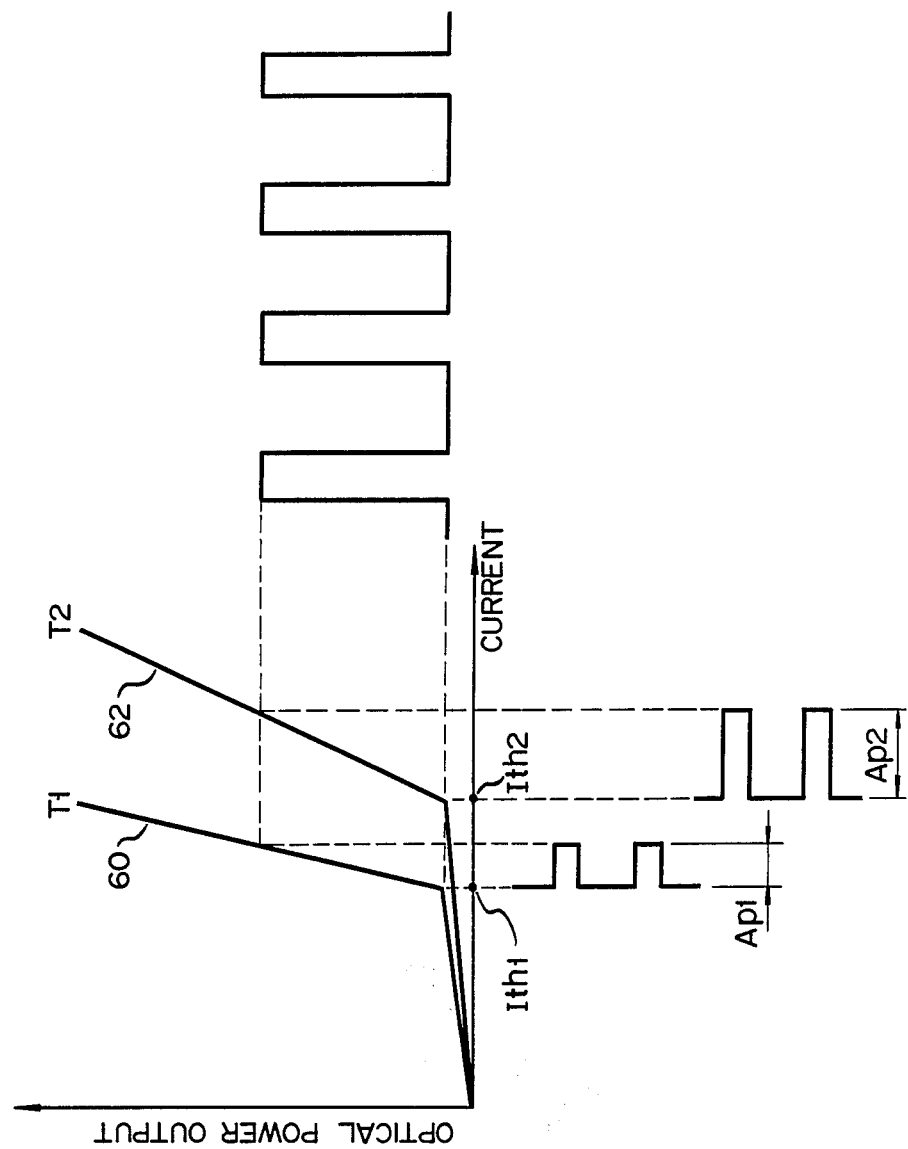

F I G. 3A 
F I G. 3B 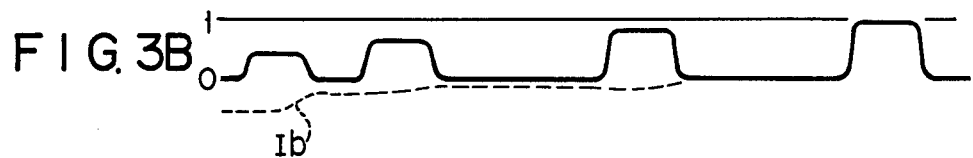
F I G. 3C 
F I G. 3D 
F I G. 3E 
F I G. 3F 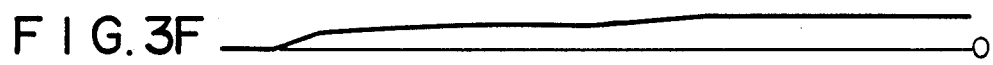
F I G. 3G 
F I G. 3H 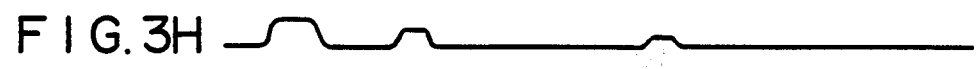
F I G. 3I 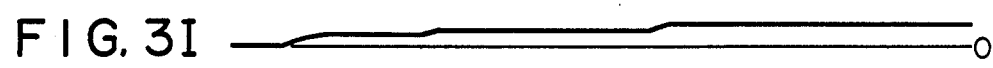

Ib

0

0

0

0

Ib

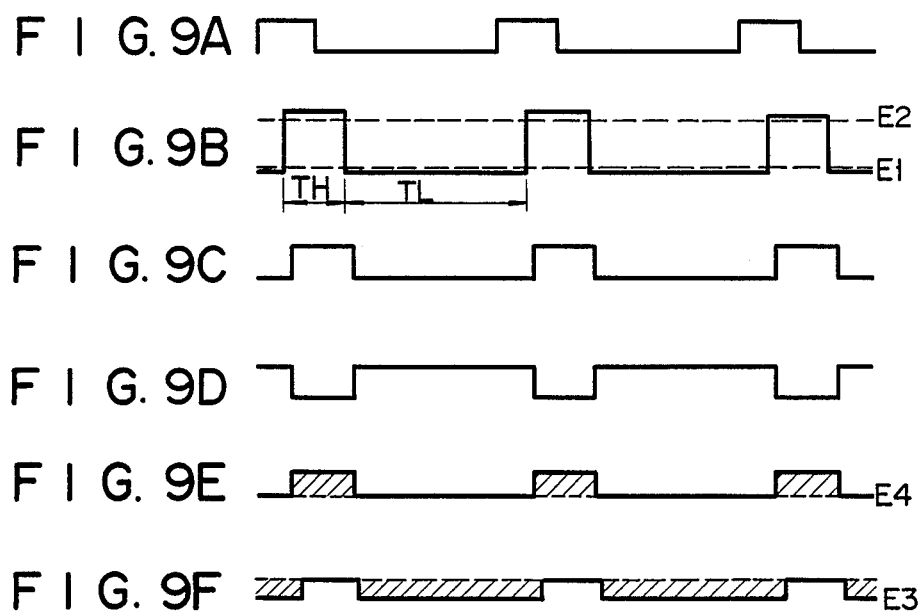
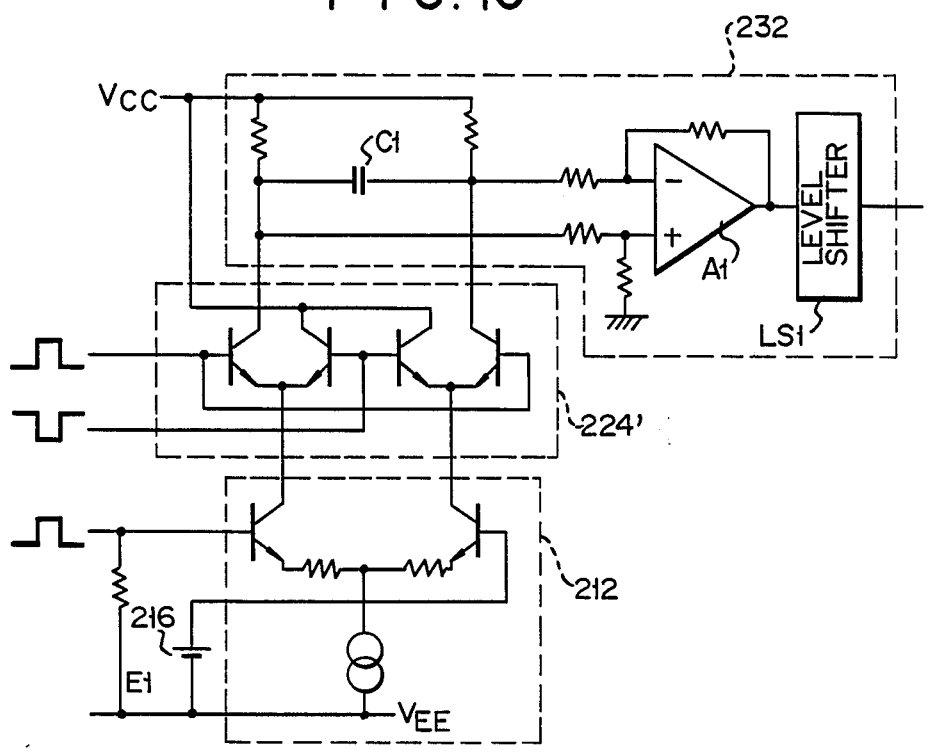

APPARATUS FOR STABILIZING THE OPTICAL OUTPUT POWER OF A SEMICONDUCTOR LASER

BACKGROUND OF THE INVENTION

1. Field of the Invention

The present invention relates to the stabilization of the optical output characteristics of a semiconductor laser and, in particular, to an apparatus for controlling a laser drive signal such that the optical output level of the laser remains substantially constant irrespective of temperature changes.

2. Discussion of Background

Recently, semiconductor laser diodes have been proposed as an electro-optical converter for use in optical communication systems to convert digital or analog electrical signals into optical signals, which are then transferred to data receiving units associated therewith through a signal transmission cable such as a known optical fiber. A problem in such application is that the optical output characteristics of a semiconductor laser change with temperature. The output characteristics which can vary are the threshold level of laser oscillation and the differential quantum efficiency.

To compensate for temperature changes in the laser output, it is required that the drive pulse signal should be effectively controlled with respect to both the biassing level of a bias current and the amplitude of drive pulses applied to the laser. In the conventional systems, however, the above technical requirements cannot be fully satisfied sufficiently, in particular, in a highspeed optical data communication. This results in that temperature changes in the optical output level of the laser cannot be compensated effectively when it continues to emit optical data signals at high speed, for example, at a data transmission rate of more than several hundred megahertz (MHz).

In Japanese patent application No. 55-83280, there is disclosed a laser output stabilizing apparatus including a device for detecting the peak level of a monitoring signal produced by a photodiode to represent the actual laser output, and a device for detecting an average value of the monitoring signal. The biasing level of a bias current for the semiconductor laser may be adjusted on the basis of the average value detected, while the amplitude of the drive pulse voltage of the bias signal is modulated in response to the detected peak value of the laser output. In such arrangement, however, it is very difficult to perform the temperature compensation if the data transmission rate is increased to reach the above-identified high level. This is because, under such condition, the peak detector cannot detect the peak level of a high-frequency laser output signal with sufficient detection accuracy.

SUMMARY OF THE INVENTION

It is therefore an object of the present invention to provide a new and improved apparatus for effectively stabilizing the optical output level of a semiconductor laser at high speed and with high accuracy.

In accordance with the above object, the present invention is addressed to a specific apparatus for stabilizing the optical output level of an electro-optical converter such as a semiconductor laser used in an optical digital data communication system. An electrical input pulse signal is supplied to the laser via a modulating drive current circuit including a current supply for supplying a d.c. bias current to the laser, and a drive circuit for supplying the laser with drive pulses corresponding to the input signal. A light sensitive device is provided for receiving a portion of light emitted from the laser to produce a first electrical signal indicative of the actual optical output level of the laser.

The input signal is also supplied to a signal processing device for producing a second electrical signal which represents an ideal output level of light to be emitted from the laser. A subtraction device is connected to the light sensitive device and the signal processor. The subtractor serves to detect the difference between integration values of the first and second signals to produce as an error signal a third electrical signal indicative of the detected difference corresponding to a change of the optical output level of the laser due to temperature change.

A temperature-compensating circuit is provided for controlling the current supply and the drive circuit in such a manner that the d.c. bias current and the amplitude of the drive pulses are independently modulated or adjusted to compensate for the temperature-change in the actual laser output level. The temperature-compensating circuit receives first and second reference signals defining reference levels of the d.c. bias current and the drive pulse amplitude required to cause the laser to emit a constant light of a predetermined output level. The temperature-compensating circuit produces first and second feedback signals based on the reference signals and the error signal. These feedback signals are respectively supplied to the current supply device and the drive circuit, which are responsive to these feedback signals to independently modulate the bias current and the amplitude of the drive pulses, thereby stabilizing the optical output level of the laser.

The invention, and its objects and advantages, will become more apparent in the detailed description of preferred embodiments presented below.

BRIEF DESCRIPTION OF THE DRAWINGS

In the detailed description of a preferred embodiment of the invention presented below, reference is made to the accompanying drawings in which:

FIG. 1 is a block schematic diagram of a first embodiment of a laser output stabilizing apparatus in accordance with the present invention;

FIG. 2 is a graph illustrating the variation of optical power output with drive current for a semiconductor laser serving as an electro-optical converter;

FIGS. 3A to 3I show waveforms of signals generated in main parts of the apparatus shown in FIG. 1 while the laser light output is being temperature-compensated as temperature is increased;

FIGS. 9A to 9F show waveforms of signals generated in main parts of the apparatus shown in FIG. 8; and FIG. 10 shows main parts of a modified circuit arrangement of the apparatus of the third embodiment of the invention.

DETAILED DESCRIPTION OF PREFERRED EMBODIMENTS

Figure 4A:
FIGS. 4A to 4I show waveforms of signals generated in the main parts of the apparatus of FIG. 1 while the laser light output is being temperature-compensated as temperature is decreased.

Referring now to FIG. 1, there is shown a laser output stabilizing apparatus used in a high-speed optical data communication system, wherein the d.c. bias current level and the amplitude of drive pulses applied to a semiconductor laser 10 are independently controlled to compensate for changes in the optical output level of laser 10 with temperature changes. The apparatus of FIG. 1 has a monitoring device 12 which receives a portion of the light from the laser to generate an electrical light detection signal 14.

Digital data of electrical pulse signal 16 is fed to a data input terminal 18, which is connected to semiconductor laser 10 via a variable resistor 20 serving as a modulating current drive circuit for adjusting the amplitude Ap of the drive pulses applied to the laser. A d.c. current supply 22 is also connected to laser 10 for supplying d.c. bias current Ib to the laser. Current supply 22 serves as a bias current adjuster which varies the current through laser 10 in response to a feedback signal 24.

Monitoring device 12 comprises a known photodiode which is optically coupled with laser 10 to receive a portion of the light from the laser during the optical data transmission. The photodiode generates detection signal 14 indicative of the actual output light level of laser 10. Signal 14 is amplified by an amplifier 26 and then supplied to a first input of a subtraction circuit 28. The input pulse signal 16 is supplied as a comparison signal to a second input of subtractor 28 via an amplifier 30 and a low-pass filter 32. Subtractor 28 effects subtraction on the two signals supplied to the first and second inputs thereof, thereby producing a subtraction signal 34 electrically representing the difference between the two signals. It should be noted that low-pass filter 32 is so designed as to have a specific transfer characteristic which is equivalently same as a summation of those of monitoring device 12 and amplifier 26. Such arrangement may allow to minimize detection errors due to the difference in waveforms of the signals supplied to the first and second inputs of subtractor 28. At least one of amplifiers 26 and 30 is adjusted so as to cause the phases of the input signals to be in coincidence with each other.

Subtraction signal 34 is supplied as an error signal to a first integration circuit 36, which then generates an integration signal 38 representing the average value of the error signal 34. Signal 38 is supplied to a first input of a differential amplifier 40 serving as a comparator. A reference voltage Vr1 is applied to a second input of differential amplifier 40. Differential amplifier 40 compares the average value signal 38 with the reference voltage Vr1 to produce a comparison signal indicative of the difference between the value of signal 38 and the reference voltage level Vr1. The comparison signal is fed back to d.c. current supply 22 as the aforementioned bias control signal 24. Therefore, when the average value of the output signal of subtractor 28 becomes larger or smaller than the reference level represented by voltage Vr1, the excessive or insufficient amount is detected by comparator 40 and then fed back to current supply 22. Current supply 22 is responsive to signal 24 to adjust d.c. bias current supplied to laser 10, whereby light output of laser 10 may be controlled to remain substantially constant.

Error signal 34 from subtractor 28 is further supplied to a first input of a multiplication circuit 42. A second input of multiplier 42 is connected to data input terminal 18 via a delay circuit 44. Delay circuit 44 serves to delay the data pulse signal 16 to compensate for delay in the waveform of error signal 34 such that the waveform of error signal 34 is matched with that of data signal 16. A delayed data pulse signal is supplied to the second input of multiplier 42.

The appropriately delayed input data pulse signal 16 and the error signal 34 are multiplied by multiplier 42, so that, unless error signal 34 is zero, the output signal from multiplier 42 contains a pulsative signal component wherein the pulse component of subtraction signal 34 is emphasized. In other words, the output signal of multiplier 42 is equivalent to the product of error signal 34 and such a weight function as to extract only the portion of the error signal 34 where the pulse of the error signal exists. As the result of the multiplication, the base of the waveform of error signal 34, which causes a measuring error in the laser optical output, is cut off. Thus it is possible to obtain a measured signal 46 which represents exactly a difference (i.e. a detection error amount) between the actual light output of laser 10 and the input data signal 16 supplied via low-pass filter 32 to subtractor 28, and which is insensitive to a measuring error of the laser light output. The measured signal 46 thus processed is supplied to second integrator 48.

Second integrator 48 performs integrating operation on signal 46 to produce an integration signal 50 indicative of the average value of signal 46. Signal 50 is supplied to a first input of a second differential amplifier 52 serving as a second comparator. Differential amplifier 52 has a second input connected to a reference d.c. voltage source and receive a reference voltage Vr2 representing a reference voltage level for integration signal 50. When the integration result output from second integrator 48 is larger than the reference voltage Vr2, comparator 52 generates a comparison signal 54 which represents difference between signal 50 and the reference level. Signal 54 is fed back to variable resistor 20 as a drive pulse control signal. Variable resistor 20 changes its resistance to modulate the amplitude Ap of drive pulses applied to semiconductor laser 10. It should be noted that integrators 36 and 48 are designed to have different time constants from each other. In this embodiment the time constant of first integrator 36 is set to be smaller than that of second integrator 48.

In the embodiment apparatus thus arranged, in an operation mode to be given later, the amplitude Ap of pulse data signal 16 is modulated in response to feedback signal 24, which is produced on the basis of the mean value (integration signal 38) of error signal 34. Further, the d.c. bias level for laser 10 is adjusted responsive to feedback signal 54, which depends on the mean value 50 of the output signal 42 of multiplier 46. Through such operation, if the optical power output of laser 10 varies up and down due to temperature variation on transmission of the light signal, the amplitude of pulse data signal 16 and the d.c. bias level for laser 10 can be appropriately controlled so as to compensate for the variation of the optical power.

FIG. 2 shows characteristic curves describing an interrelation between the drive current vs. optical power output of semiconductor laser 10. Curve 60 illustrates a variation of the optical power output of laser 10 when temperature is T1. Curve 62 shows a variation of the optical power output of laser 10 when temperature rises to T2 (this temperature rise depends on temperature rise of the laser oscillating element and/or ambient temperature). Reference "Ith1" indicates the laser threshold current of laser 10 at temperature T1, and "Ith2" indicates the laser threshold current of laser 10 at higher temperature T2. The operation mode of the optical power stabilizing device will be described referring to the characteristic curves of FIG. 2. For the description, two typical cases will be used; the laser temperature rises from temperature T1 to T2 and it falls from T2 to T1. As seen from the graph, when the laser temperature of laser 10 rises, an inclination of the characteristic curve of laser 10 is greater. Therefore, for a fixed bias current and a fixed drive voltage, the optical output power from the stabilizing device also becomes small.

The stabilizing operation of the optical output power, when the laser temperature rises from T1 to T2, will first be described. The assumption is made that, when the temperature changes, the data signal 16 with a pulse waveform shown in FIG. 3A is initially supplied to the data input terminal 18 of the stabilizing apparatus. The rectangular waveform at the leftmost end in FIG. 3B shows the reduced optical power output. With this reduction of the optical power, the amount of laser light received by monitoring photodiode 12 reduces. Therefore, the detection signal 14 output from amplifier 26 and guided to the first input of subtractor 28, is also reduced (see FIG. 3C). (The fact that the waveform of signal 14 becomes less steep like a pseudo-sine curve, as shown in FIG. 3C, is caused by one of the ordinary low-speed photodiodes for the monitoring photodiode 12). During this period, The pulse waveform of the data signal transmitted to input terminal 18 remains unchanged, so that the waveform of the signal at the second input of subtractor 28 is fixed in shape, as shown in FIG. 3D. Therefore, the difference between a signal level of the reduced detection signal 14 and the signal with the limited frequency band, which is supplied through lowpass filter 32 and corresponds to the data pulse, is increased to increase the output signal from subtractor 28, i.e. the error signal. The waveform of the increased error signal 34 is illustrated on the left side in FIG. 3E.

The increased error signal 34 is integrated by integrator 36. The output signal level of integrator 36 steeply increases, as shown in FIG. 3F. The output signal (representing an averaged value or a mean value of error signal 34) of integrator 36 is compared with reference voltage Vr1, by means of comparator 40. The output signal 24 of comparator 40, which represents a difference between the integrator output signal and the reference voltage, is fed back to d.c. current supply 22. The current supply 22 increases d.c. bias current Ib to laser 10, as indicated by a broken line in FIG. 3B. The increase of bias current Ib continues until the laser threshold level changes from "Ith1" to "Ith2", as shown in the characteristic graph of FIG. 2. The reason for this is that, when the laser threshold level reaches "Ith2", the optical output power of laser 10 is equal to that at temperature T1, and the error signal 34 becomes zero and the output of integrator 36 is also zero. As a result, the temperature compensation control for the laser bias current is stopped.

During the temperature rise from T1 to T2, data pulse 16 is constantly supplied through delay circuit 44 to the second input of multiplier 42. The waveform of the output signal of delay circuit 44 is coincident with that of data pulse 16, as shown in FIG. 3G. Therefore, the signal supplied to the second input of multiplier 42 takes a waveform in which the pulse component of input data signal 16 is clearly emphasized. This and the error signal 34 are multiplied by multiplier 42. Therefore, only the overlapping portion of the unsteeped (blunted) waveform of error signal 34 and that of the output signal of the waveform delay circuit 44 in which the pulse component of input data signal 16 is emphasized, is extracted, while the other portion of the signal waveform (the base of the unsteeped waveform of error signal 34) is removed. As a result, multiplier 42 generates signal 46 with a sharp waveform shown in FIG. 3H, which is supplied to integrator 48. The integrator 48 integrates signal 46. With the reduction of the optical output power of laser 10 due to temperature rise from T1 to T2, when the output signal 46 of multiplier 42 is increased, the integration results of integrator 48 increase, as shown in FIG. 3I. The output signal from integrator 36 is fed back to variable resistor 20, via comparator 52. Therefore, the variable resistor 20 increases the amplitude Ap of the data pulse applied to laser 10 (its initial value is Ap1 at temperature T1), as shown in FIG. 2. The increase of drive pulse amplitude Ap continues until the peak-to-peak value of the optical output power of laser 10 at temperature T1 is equal to that of the optical output power at temperature T1, as shown in the characteristic curve of FIG. 2. It is for this reason that, if the laser output increases up to the above-mentioned level, the error signal 34 becomes zero, and the integration output of integrator 48 is held to the last level. As a result, the temperature compensation control of the amplitude of the laser drive voltage is stopped.

Figure 4B:
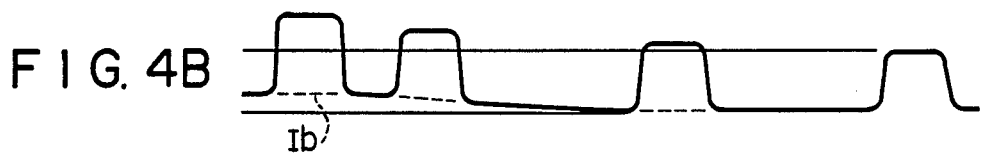
Figure 4C:
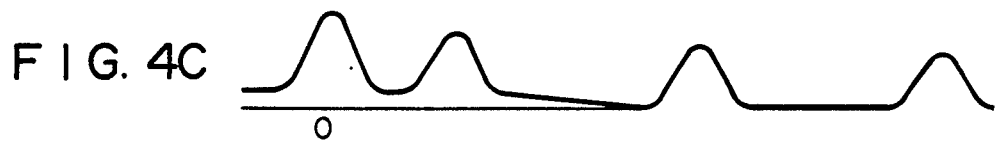
Figure 4D:
Figure 4E:

Since the time constant of integrator 48 is set to be larger than that of integrator 36 as described above, the laser bias current Ib reaches a stable level before the amplitude of the laser drive voltage is temperature compensated for. In other words, the temperature compensation operation for the laser bias current is completed earlier than that for the laser drive voltage. This means that the temperature compensation (stabilizing control) for the bias current is performed prior to that for the drive voltage amplitude. Accordingly, when the temperature rises from T1 to T2, the temperature compensation for the bias current is first performed. Then, an optimum stabilized level of the amplitude of the drive voltage at the bias current level thus stabilized is determined. By performing the stabilizing control of the optical power output of semiconductor laser 10 in such a sequence, the operation speed for the stabilizing can be improved. The process of the optical power output stabilizing operation, when the temperature falls from T1 to T2, will be described, referring to FIGS. 4A to 4I. At this time, the optical power output of the laser increases with temperature drop (see FIG. 4B). Therefore, the waveform of the signal to the second input of subtractor 28 is left unchanged irrespective of the temperature drop (as shown in FIG. 4D). The output signal of subtractor 28, i.e. the error signal 34 reduces to a negative value (see FIG. 4E).

Figure 4F:
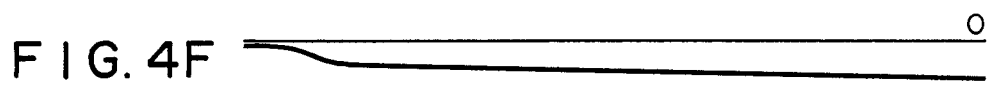
Figure 4G:

The output signal 38 of integrator 36 decreases to below the zero level, as shown in FIG. 4F. Signal 38 is fed back to current supply 22 via comparator 40. The current supply 22 decreases the DC bias current Ib to laser 10, as indicated by a broken line in FIG. 4B. The decrease of the bias current Ib terminates when the laser threshold level passes from "Ith2" to Ith1" as illustrated by the characteristic graph of FIG. 2.

Figure 4H:
Figure 4I:

When temperature falls, the data pulse 16 is supplied through delay circuit 44 to the second input of multiplier 42. The output signal of delay circuit 44 has a waveform in which the presence of the pulse component of input data signal 16 is emphasized. This signal and error signal 34 are multiplied by multiplier 42. Accordingly, only the overlapping portion of the unsteeped waveform of error signal 34 and the waveform of the output signal of the waveform delay circuit 44 containing the emphasized pulse component of input data signal 16, is extracted. As a result, the output signal 46 of multiplier 42 includes the negative signal components (each component is stopped at both sides) as shown in FIG. 4H. Therefore, integration signal 50 continuously decreases, while keeping its level below the zero level, as shown in FIG. 4I. Comparator 52 detects a difference between signal 50 and reference signal "Vr", and feeds the feedback signal 54 to variable resistor 20. In response to this signal, variable resistor 20 decreases the amplitude value Ap of laser drive pulse, as shown in FIG. 2, thereby to stabilize the optical power output.

Remarkably useful technical advantages as obtained by the apparatus for stabilizing the optical output power of a semiconductor laser, will be described below.

Firstly, even if an ordinary photodiode of low speed or of low response is used for monitoring device 12, the laser output power stabilizing apparatus can perform the temperature compensation operation of laser output at high speed and high accuracy. The reason for this is that, in order to stabilize the optical output level of laser 10, the error signal 34 representing the increase or decrease due to temperature variation in the laser output power is obtained by subtracting the detection signal 14 of monitoring photodiode 12 and the output signal of low-pass filter 32 with a transfer characteristic comparable with that of the photodiode. This output signal corresponds to the input data pulse and those frequency band is limited by low-pass filter 32.

Secondly, the feedback controls of the laser bias current Ib and the amplitude Ap of the laser drive pulse are independently performed on the basis of the integration value of error signal 34. Therefore, if the temperature changes in any way, it is possible to determine the bias current level and the drive pulse voltage, which are instrumental to stabilize the optical power output under such conditions. By this feature, the accuracy of temperature compensation of laser 10 can be improved. In this case, error signal 34 is obtained by subjecting, to the subtraction process, the integration value of the output signal of photodiode 12 and the integration value of the pulse signal as obtained by passing input drive pulse signal 16 through low-pass filter 32. Therefore, the error signal 34 faithfully represents a temperature variation of the optical output power of laser 10. By using such subtraction results as parameters, the disadvantage of the prior device as disclosed in Japanese application No. 55-83280 (that the peak points of the output signal of the monitoring photodiode must be detected or sampled by using a high-frequency clamping circuit) can be avoided. With this feature, the laser power output can be stabilized with high speed and high accuracy with a simple circuit construction.

Thirdly, an accuracy of error signal can be improved. The laser drive pulse voltage is controlled by using signal 46 resulting from the multiplication of the error signal 34 and the signal as obtained by delaying the input data pulse 16 by delay circuit 44. The signal 46 takes a unique signal waveform (approximate to a pseudo rectangular pulse shape), because it is multiplied by a weight function so as to emphasize the presence of the waveform of the input pulse components. Therefore, the signal 46 exactly describes a temperature variation of the laser output, and yet is insensitive to a detection error. Therefore, improvement is made in the precision of the comparing operation (amplitude comparison) of the integration signal 50, which results from the integration of the signal 46 by second integrator 48, and the reference voltage by comparator 52. This fact contributes to the improvement of the precision of the amplitude control of the current drive pulse for the temperature compensation of laser 10.

Finally, when the temperature varies, the bias current to laser 10 and drive voltage can quickly be stabilized to an optimum level. The time constant of the first integrator 36, which is for the laser bias current control, is set to be different from that of the second integrator 48 for the laser drive pulse voltage control. With this, one of the controls of the drive pulse amplitude Ap or the control of bias current Ib is terminated prior to the other. Then, the remaining one is terminated. Therefore, when the temperature varies, the bias current to laser 10 and the drive voltage may be quickly stabilized to an optimum level.

Figure 5:
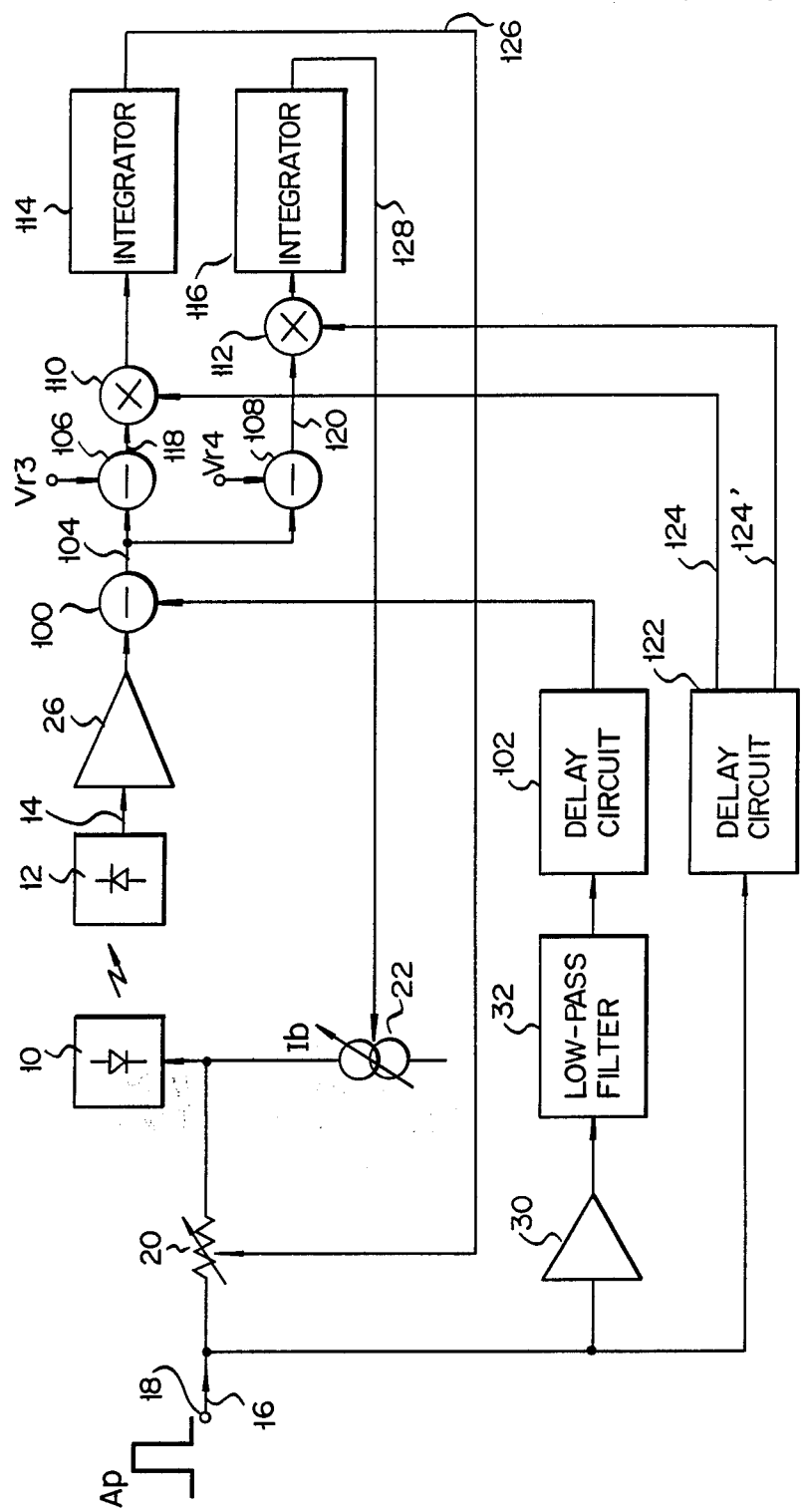
FIG. 5 is a block schematic diagram of a second embodiment of apparatus in accordance with the present invention.

FIG. 2 shows a circuit arrangement of a laser output stabilizing apparatus in accordance with another embodiment of the invention. In FIG. 5 the same reference numerals are used to designate the same circuit components as in the aforementioned embodiment of FIG. 1, and the detailed description thereof will be omitted for the sake of simplification of the specification.

In the apparatus of FIG. 5, light detection signal (monitoring signal) 14 from photodiode 12 is supplied via amplifier 26 to a first input of a subtracting circuit 100. Digital data of electrical pulse signal 16 is fed to a second input of subtractor 100 via amplifier 30, low-pass filter 32 and a delay circuit 102. Data pulse signal 16 is subjected to low-pass filtering and phase-delayed in such a manner that the phase of this signal is adjusted to be substantially coincident with that of the amplified light detection signal 14.

Subtractor 100 effects subtraction processing on the two signals supplied to the first and second inputs thereof, thereby producing an error signal 104 indicative of the difference between the two signals. Error Signal 104 is transferred to first inputs of other subtractors 106 and 108. Reference voltages Vr3 and Vr4 electrically defining two different reference levels (peak reference level and minimum reference level) for the error signal are respectively applied to second inputs of subtractors 106 and 108. The outputs of subtractors 106 and 108 are connected via multipliers 110 and 112 to integrators 114 and 116, respectively. Integrators 114 and 116 are different from each other in their time constants.

Subtractor 106 detects the difference between error signal 104 and the peak reference level Vr3 to generate a signal 118 which directly represents an error level at the logic "high" level of the actual laser output pulse. Signal 118 is supplied to multiplier 110. On the other hand, subtractor 108 detects the difference between error signal 104 and the minimum reference level Vr4 to generate a signal 120 indicative of an error level at the logic "low" level of the actual laser output pulse. Signal 120 is fed to multiplier 112.

A delay circuit 122 is provided to receive drive pulse signal 16 and generate a delayed signal 124 and another delayed signal 124' having an inverted waveform, which are respectively supplied to second inputs of multipliers 110 and 112. Accordingly, a delayed drive pulse signal (124) is multiplied by multiplier 110 with the output signal 118 of subtractor 106. A delayed and inverted drive pulse signal (124') is multiplied by multiplier 112 with the output signal 120 of subtractor 108. The signal-delaying processing applied to pulse signal 16 is required to compensate for phase delay which tends to be generated in error signal 104, whereby the phase of error signal 104 may coincide with that of drive pulse signal 14.

The multiplication applied on the high-level-error signal (118) from subtractor 106 and the delayed drive pulse signal 124 is performed in such a manner that pulse components included in high-level-error signal 118 are electrically emphasized to extract pulsating waveforms of error components at the logic "high" level, i.e., the upper peak points of the laser light. The multiplication on the low-level-error signal (120) from subtractor 108 and the inverted signal 124' of the delayed drive pulse signal is performed whereby pulse components included in low-level-error signal 120 are emphasized to extract pulsating waveforms of error components at the logic "low" level, i.e., the minimum level of the laser light. These signals 118 and 120 are subjected to integration processings at integrators 114 and 116, and thereafter fed back as control signals 126 and 128 to variable resistor 20 controlling the drive pulse voltage applied to laser 10 and current controller 22, respectively.

In the embodiment thus arranged, in an operation mode to be described in detail later, the amplitude of pulse data signal 16 is controlled on the basis of the integration value (or control signal 126) of the peak level error detection signal 118 of the error signal 34. The d.c. bias level of laser 10 is controlled on the basis of the integration value, or control signal 128, of the minimum level error detection signal 120 of error signal 34. Through such controls, even if the optical power output of laser 10 changes due to temperature change during the transmission of the optical signal, the amplitude of pulse data signal 16 and the d.c. bias level of laser 10 can be appropriately controlled so as to compensate for the change of the optical power output.

Figure 6A:
FIGS. 6A to 6J show waveforms of signals produced in main parts of the apparatus of FIG. 5 while the laser light output is being temperature-compensated as temperature is increased.
Figure 6B:
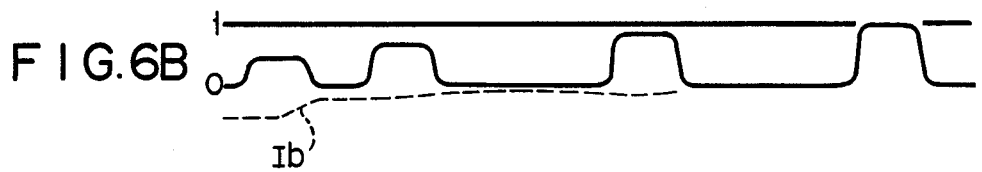
Figure 6C:
Figure 6D:
Figure 6E:

FIG. 6A shows a pulse waveform of data signal 16 supplied to data input terminal 18. When the temperature rises from T1 to T2, the optical output power of laser 10 decreases. A rectangular waveform on the left side in FIG. 6B illustrates the reduced optical output power. With this power drop, the amount of laser light received by monitoring photodiode 12 also decreases, so that light detection signal 14 output from amplifier 26 and led to the first input of subtractor 100 is also decreased (see FIG. 6C). (The waveform of signal 14 at this time, as shown in FIG. 3C, is less sharp, like a pseudo sine wave. The reason for this is that an ordinary low-speed photodiode is used for the monitoring device 12). During this detection signal drop, the pulse waveform of the data signal transmitted to input terminal 18 remains unchanged. Therefore, the signal waveform at the second input terminal of subtractor 100 is also unchanged, as shown in FIG. 6D. As a result, there is an increase in the difference between the signal level of the reduced light detection signal 14 and a band-limited signal corresponding to the data pulse and supplied through low-pass filter 32 and delay circuit 102. The band-limited signal has an unsteeped (blunted) waveform due to the low-pass filtering, as seen from FIG. 6D. At this time, the output signal of subtractor 100, i.e., error signal 104, also increases (see the left side waveform in FIG. 6E).

Figure 6F:
Figure 6G:
Figure 6H:
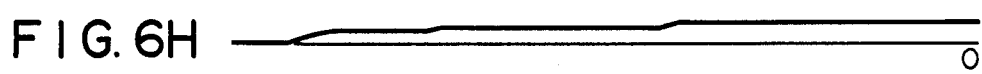
Figure 6I:

The error signal 104 is subtracted from peak reference Vr3 by subtractor 106, to provide high-level-error signal 118. At the same time, the error signal 104 is subtracted from minimum reference level Vr4 by subtractor 108, to provide low-level-error signal 120. These signals 118 and 120 are supplied to multipliers 110 and 112, respectively. The phase (see FIG. 6F) of the signal 124 from delay circuit 112 is coincident with that of the output signal 118 of subtractor 106. Hence, the output signal of multiplier 110 has a waveform in which the pulsative component is emphasized (i.e., it is weighted by the weight function), as shown in FIG. 6G. The output signal of multipier 110 is integrated by integrator 114 to form an integration signal 126 with a waveform as shown in FIG. 6H. The integration signal 126 represents an integration value (mean value) of an increase of the high-level-error component of error signal 104, which is caused by its decrease due to temperature rise of optical power output of laser 10. Therefore, integration signal 126 relatively steeply increases as shown in FIG. 6H. Signal 126 is fed back to variable resistor 20. Variable resistor 20 increases the amplitude Ap of drive pulses to laser 10 according to the integration value of an increase of the high-level error component.

Figure 6J:
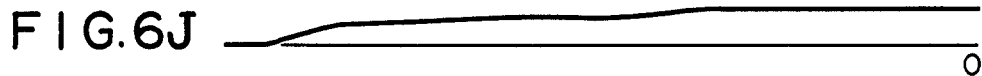

The low-level error signal 120 is multiplied by the inverted delay signal 124' by means of multiplier 112. The output signal of the multiplier 112 has a waveform in which the pulse component is emphasized (i.e., it is weighted by the weight function). The output signal of multiplier 112 is integrated by integrator 116, to provide integration signal 128 with a waveform as shown in FIG. 6J. Integration signal 128 thus represents an integration value (mean value) of an increase of the low-level error component in the error signal 104, which is caused by a decrease of integration signal 128 due to temperature rise. Therefore, integration signal 128 relatively steeply increases. Integration signal 128 is fed back to variable DC current source 22. Current source 22 effects the bias current Ib to laser 10, as shown by a broken line in FIG. 6B, according to an integration value of the increase of the low-level-error component. The increase of this bias current Ib terminates when the laser threshold level of laser 10 at temperature T2 reaches "Ith2" (see FIG. 2).

The time constant of integrator 114 is set to be smaller than that of integrator 116. Then, laser bias current Ib always reaches a stable level before the amplitude of the laser drive voltage is temperature compensated. In other words, the temperature compensating operation for the laser bias current is completed earlier than that of the laser drive voltage. This indicates that the temperature compensation (stabilizing control) of the bias current is performed prior to that of the amplitude of the drive voltage. This fact contributes to the improvement of the operating speed for stabilizing the laser output power.

Figure 7A:
FIGS. 7A to 7J show waveforms of signals produced in the main parts of the apparatus of FIG. 5 while the laser light output is being compensated as temperature is decreased.
Figure 7B:
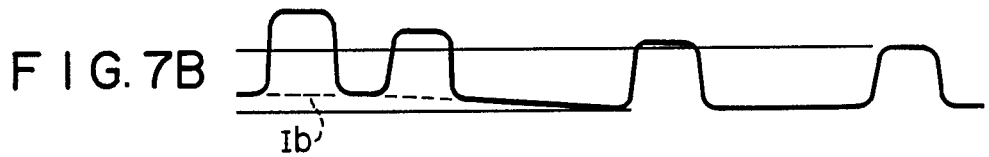
Figure 7C:
Figure 7D:
Figure 7E:
Figure 7F:
Figure 7G:
Figure 7H:
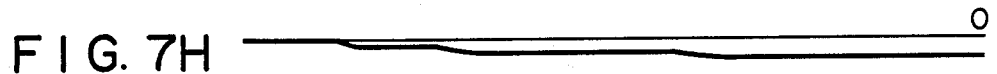

When temperature falls from T2 to T1, the laser output power level increases as illustrated by a waveform on the left side in FIG. 7B. With an increase of the power level, the detection signal 14 output from amplifier 26 and guided to the first input of subtractor 100 is also increased (see FIG. 7C). During this period of detection signal increase, a signal waveform to the second input of subtractor 100 remains unchanged, as shown in FIG. 7D, so that the output signal of subtractor 100, or error signal 104 decreases to a negative value (see FIG. 7E). The phase of the signal 124 from delay circuit 112 (see FIG. 7F) is coincident with the phase of the output signal 118 from subtractor 106. Accordingly, the high-level error signal 118 output from subtractor 106 swings to the negative region, as shown in FIG. 7G, and takes a waveform in which the pulse component is emphasized, i.e., the waveform is multiplied by the weight function. The output signal from multiplier 110 is integrated by integrator 114, to become integration signal 126 with the waveform as shown in FIG. 7H. This integration signal 126, therefore, represents an integration value of a decrease of the high-level error component to the negative side, which is caused by an increase of the laser power output of laser 10 due to temperature drop. This integration signal 126 varies in the negative region, as shown in FIG. 7H. Responsive to the integration signal 126, variable resistor 20 decreases the amplitude Ap of the input drive pulse signal according to the integration value of high-level error component.

Figure 7I:
Figure 7J:
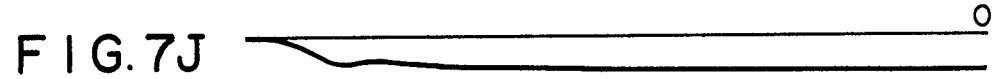

The low-level error signal 120 is multiplied by the inverted delay signal 124', by means of multiplier 112, to have a waveform as shown in FIG. 7I. The output signal of multiplier 112 is integrated by integrator 116, to become integration signal 128 with a waveform as shown in FIG. 7J. Signal 128 represents an integration value (mean value) of a variation of the low-level-error component of error signal 104, which is caused by its increase due to the temperature decrease of the laser power output. Therefore it varies as shown in FIG. 7J. Responsive to this integration signal 128, bias current modulator 22 decreases the bias current Ib to laser 10, as indicated by a broken line in FIG. 6B. As a result, the laser threshold current of laser 10 at temperature T1 reaches "Ith1" (See FIG. 2).

According to the second embodiment of this invention, the feedback controls of laser bias current Ib and the amplitude Ap of drive pulses are separately performed by independently detecting the integration values of variations in the peak and minimum levels of error signal 104. For this reason, the laser output power stabilizing device of the second embodiment can perform the temperature compensation of the laser output power with high speed and high accuracy, without use of a high-speed monitoring diode and high frequency characteristic peak hold circuit which are used in a conventional device. The second embodiment, of course, can obtain the effects comparable with those of the first embodiment.

Figure 8:
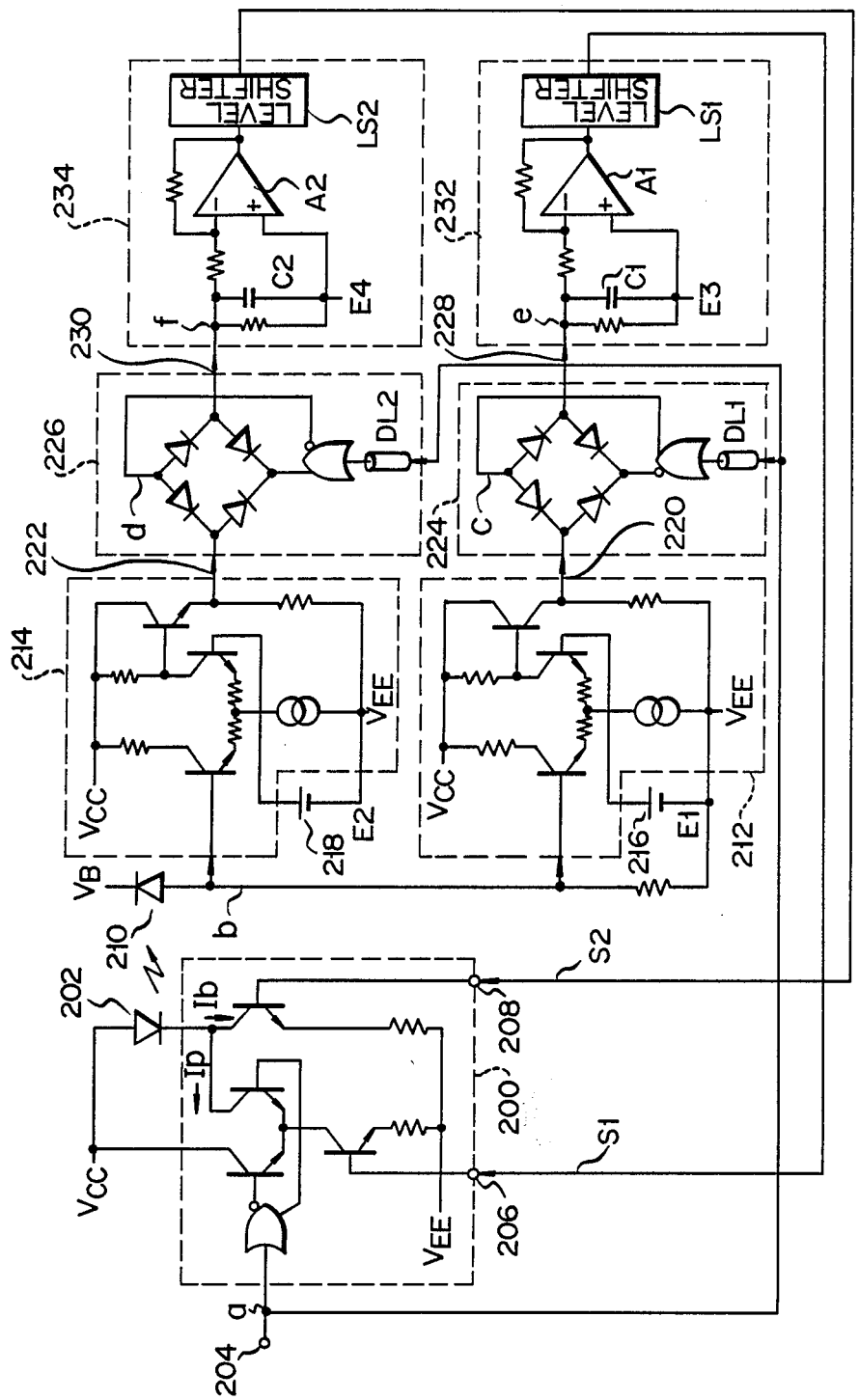
FIG. 8 is a block schematic diagram of a third embodiment of apparatus in accordance with the invention.

FIG. 8 shows a laser output stabilizing apparatus in accordance with a third embodiment of the invention. This embodiment apparatus has a modulating circuit 200 connected to a semiconductor diode 202 and an input terminal 204 to which an input digital data signal is supplied. Modulator 200 converts the input signal into a pulse drive current Ip which is superposed with a bias current Ib to drive laser 202. The amplitude of pulse drive current Ip and the biassing level of bias current Ib may be independently varied in response to feed-back signals S1 and S2 supplied to first and second control terminals 206 and 208.

Laser 202 emits an optical pulse signal corresponding to the digital data signal, which is then transferred to an optical signal transmission cable (not shown) for data communication. The optical output of laser 202 is also sensed by a monitoring photodiode 210, which produces a light detection signal. Photodiode 210 is connected to first and second difference-detectors 212 and 214. The light detection signal is fed to first inputs of difference-detectors 212 and 214 as a monitoring signal indicative of the actual output level of laser 202.

The d.c. voltage source 216 for generating a low reference voltage level E1 and d.c. voltage source 218 for generating a high reference voltage level E2, respectively, are connected to the second input terminals of difference detectors 212 and 214. The low reference voltage level E1 serves as a reference level for detecting a logic "high" level of the laser power output pulse. The high reference voltage level E2 serves as a reference signal for detecting a logic "low" level of the laser power output pulse. Difference detection circuit 212 compares the light detection signal from monitoring photodiode 210 with the reference voltage level E1, to produce a first error signal 220 representing a difference between them. The first and second error signals 220 and 222 are supplied to first and second subtracting circuits 224 and 226, respectively.

Subtracting circuits 224 and 226 include delay lines DL1 and DL2 to which the data pulse signal is supplied. Delay lines DL1 and DL2 delay the data pulse signal to such an extent to compensate for the phase delay of the detection signal which is caused at the time of light sensing by photodiode 210. By this delay processing, a sampling pulse is generated. Subtractor 224, using the sampling pulse from delay line DL1, extracts a pulse contained in the logic "high" level period (designated as "TH" in FIG. 9B) of first error signal 220. Therefore, the output signal 228 from this circuit 224 represents an error component of error signal 220 during the logic "high" level, which the error component corresponds to a variation of the laser power output from laser 202, which is due to temperature variation. Another subtractor 226, using the sampling pulse signal from delay line DL1, extracts the pulse component contained in the logic "high" level period of first error signal 220 (designated as "TH" in FIG. 9B), and generates a sampled output signal 230 representative of a laser output error component contained in the logic "low" level period TL of error signal 222.

The output signals 228 and 230 of subtractors 224 and 226 are applied to mean value detection circuits 232 and 234, respectively. Circuit 232 includes a differential amplifier A1 with an inverting input coupled with the signal 228 and a non-inverting input to which a bias voltage E3 is applied. A smoothing capacitor C1 is provided between the two inputs of differential amplifier A1, and serves as a mean value detection device of output signal 228 of subtractor 224. The output of differential amplifier A1 is connected to control terminal 206 of modulator 200 via a level-shifting circuit LS1. Another mean value detection circuit 234 includes a differential amplifier A2 having an inverting input to which the signal 230 is supplied and non-inverting input to which a bias voltage E4 is applied. A smoothing capacitor C2 for mean value detection is connected between the two inputs of differential amplifier A2. The output of differential amplifier A2 is connected to control terminal 208 of modulator 200 via level shifting circuit LS2. These circuits 232 and 234 detect the mean values of signals 228 and 230, and feed back these detected mean value signals, as first and second control signals S1 and S2, to the control terminals S1 and S2 of modulator 200. In response to these control signals S1 and S2, the amplitude Ip of the drive pulse to laser 202 and the bias current Ib are independently controlled, to compensate for the variation of the laser power output.

FIGS. 9A to 9F show waveforms of signals generated at key points in the circuit configuration of FIG. 8. The digital data signal supplied to terminal 204 takes a pulsative waveform as shown in FIG. 9A. When the optical power output level of laser 202 varies due to temperature variation, the light detection signal (monitor signal) from monitoring photodiode 210 varies according to the power output level variation. The light detection signal has a waveform directly representing the power output variation of laser 202 (See FIG. 9B). The light detection signal is applied to difference detectors 212 and 214, where it is compared with reference voltage levels E1 and E2. By the comparisons, first and second error signals 220 and 222 are produced. These signals 220 and 222 are sampled by subtractors 224 and 226, to provide signals 228 and 230, whose waveforms are shown in FIGS. 9E and 9F. It should be noted that although sharp rectangular pulse waveforms are illustrated in FIGS. 9E and 9F, the actual waveforms are blunted like a sine wave, due to the presence of smoothing capacitors C1 and C2.

In mean value detector circuit 232, the input bias voltage E3 is set to the same level as the output voltage generated in subtractor 224 when the light detector signal of the monitoring photodiode 210, is the same value as the reference voltage E1. Therefore, the mean value of the signal component during the logic "high" level period TH, which is hatched in FIG. 9E, is considered to be the value to be returned to terminal 206 of modulator 200. The detector signal which indicates the mean value of output signal 230 of subtractor 226 during the logic "high" level TH, is inversion-amplified by differential amplifier A1, and adjusted by level shifter LS1, so as to have a level high enough to match the voltage level of terminal 206 of modulator 200. As a result, the voltage which is returned to terminal 206 corresponds directly to the amount of fluctuation of the power output of laser 202, which is produced by temperature changes, and has a voltage level of inverse polarity. For example, when the laser power output of laser 202 is reduced by a temperature increase, a feedback signal S1 large representing an increased amplitude of laser drive pulse Ip necessary for compensating for the decrease in laser power output, is supplied to terminal 206 of modulator 200. When the laser output power is increased by a temperature drop, a feedback signal S1, which reduces the amplitude of laser drive Ip, and compensates for the laser power output rise, is supplied to terminal 206 of modulator 200.

In mean value detector circuit 234, input bias voltage E4 is set to the same level as the output voltage generated in subtractor 226 when the light detector signal and reference voltage E2 are the same. Therefore the mean value of the signal component during the logic "low" level period TL, which received hatch processing in FIG. 9F, is considered to be the value to be returned to terminal 200 of modulator 200. The detector signal which indicates the mean value of output signal 228 of subtractor 224 during the logic "low" level TL, is inversion-amplified by differential amplifier A2, and is adjusted by level shifter LS1, to a suitable level for application to modulator terminal 208. The voltage returned to terminal 208 corresponds directly to the changes in the laser power output, which is produced by temperature changes, and has a voltage level of opposite polarity. Accordingly, when the laser output power of laser 202 is reduced, the potential of control signal S2, which is applied to terminal 208 of modulator 200, becomes large enough to increase bias current Ib sufficiently to compensate for the drop in laser output power. When the laser power output increases, control signal S2 assumes a value which decreases the bias current Ib to compensate for the laser power output increase.

In the third embodiment explained above, the light detector signal from monitoring photodiode 210 is divided into two parts, the signal component (220) of the logic "high" level TH, and the signal component (222) of the logic "low" level TL. These signal components are subtracted from the delayed digital data signals by subtractors 224 and 226. Thus, the amplitude of the Ip of the drive pulse to laser 202 can be controlled in accordance with the error component occurring in the logic "high" level period TH of the light digital data signal, and the bias current to laser 202 can be controlled in accordance with the error component of the light digital data signal during the logic "low" TL period. With these two feedback controls, which are independent from each other, the laser output power level is not dependent upon temperature changes, and can be effectively stabilized to a constant level. Also, with this circuit configuration, the sample-hold circuits with the high frequency characteristics, that were necessary for the laser output high-speed stabilizing control in earlier devices, are completely unnecessary. Accordingly, while simplifying the configuration of the laser output stabilizing device, the temperature compensation speed of semiconductor laser 202 is increased. Also, if the time constant of mean value detection circuits 232 and 234 is set so as to narrow the frequency band of the feedback control loop to modulator 200, the charge oscillations in smoothing capacitors C1 and C2, adverse effects, can easily be removed.

Although the invention has been described with reference to specific embodiments, it shall be understood by those skilled in the art that numerous modifications may be made that are within the scope of the inventive contribution.

For instance, the detection of the error signal that occurs when the laser output power varies is not limited to that of the embodiment explained above. FIG. 10 shows an example of a modification of the important circuit section of the third embodiment explained above. In this modification, as explained below, differential detection is used to detect the error signal.

As made clear by FIG. 8, since the control loop of drive bias current Ib and the control loop of drive pulse amplitude Ip can be accomplished with circuits that are almost alike, only a portion of the control loop of drive pulse amplitude Ip is shown for this embodiment. Difference signal detection circuit 212, subtractor 224 which serves as a level detector circuit, and mean value detector circuit 232 are each configured in the differential ways.

With this type of configuration, the same effects as those of the above third embodiment and further the following effects are obtained. Since the difference signal detector circuit, level detector circuit, and mean value detector circuit, etc., have differential configurations, a difference signal contained during the detection of the feedback signal and the drift in the difference signal detection circuit and the level detection circuit, which may be mixed at the time of the detection of the feedback signal, can be removed, thereby improving accuracy of detecting the feedback signal.

What is claimed is:

1. An apparatus for stabilizing an optical output level of an electro-optical converter, said apparatus comprising:

modulator means for supplying said converter with drive pulses corresponding to an electrical input pulse signal, said modulator means further feeding a d.c. bias current to said converter;

light sensitive means for producing a first electrical signal indicative of the actual optical output level of said converter;

signal processing means for receiving said pulse signal to produce a second electrical signal indicative of an ideal optical output level of said converter;

subtraction means for detecting a difference between integration values of said first and second signals to produce as an error signal a third electrical signal indicative of a change in the actual optical output level of said converter; and temperature-compensation means for receiving said electrical input pulse signal and said third signal, for applying a multiplication operation to said pulse signal and said third signal to extract a pulse component from said third signal, for generating a wave-shaped error signal in which a pulse component of said third signal is emphasized, and for producing first and second feedback signals based on said wave-shaped error signal to feed these feedback signals to said modulator means, said modulator means being responsive to said first and second feedback signals to independently modulate said d.c. bias current and the amplitude of said drive pulses applied to said converter, whereby the actual optical output level remains substantially constant.

2. The apparatus according to claim 1, wherein said temperature-compensation means comprises:

integration means for integrating said error signal to generate first and second mean value signals, which are compared with a first and second reference voltage and fed back to said modulator means; and multiplying means connected to said integration means, for performing said multiplication operation to said electrical input pulse signal and said third signal, and for supplying said wave-shaped error signal to said integration means.

3. The apparatus according to claim 1, wherein said temperature-compensation means comprises:

integration means for integrating said third signal to generate first and second mean value signals; and comparing means for receiving a first and a second reference voltage respectively defining said d.c. bias current necessary for said electro-optical converter to keep a predetermined laser output power level, and a reference level of the width of said drive pulse, and for comparing said first and second mean value signals with said first and second reference voltages to generate first and second difference signals, said first and second difference signals being fed back to said modulator means, as said first and second feedback signals.

4. The apparatus according to claim 3, wherein said temperature compensation means further comprises:

multiplying means having a first input connected to said third error signal, a second input connected to said electrical input pulse signal, and an output connected to said integration means, said multiplying means extracting a pulse wave component from said third signal on the basis of said electrical pulse signal, and supplying said wave-shaped error signal to said integration means.

5. The apparatus according to claim 4, further comprising:

delay circuit means connected to said multiplying means, for delaying said electrical pulse signal to make a phase of said electrical pulse signal coincident with that of said third signal.

6. The apparatus according to claim 5, wherein said integration means has first and second integration circuits with different time constants.

7. The apparatus according to claim 1, wherein said temperature-compensation means comprises:

subtractor means for receiving first and second reference voltages defining the peak and minimum levels of the laser power output of said electro-optical converting means, for detecting differences between said third signal and said first reference voltage, and between said third signal and said second reference voltage, and for detecting differences between the first and second difference signals and said first and second reference voltages, thereby to generate first and second difference signals; and integration means connected to said subtractor means, for integrating said first and second difference signals to generate first and second mean value signals, said first and second mean value signals being fed back to said modulator means.

8. The apparatus according to claim 7, wherein said temperature-compensation means further comprises:

multiplier means connected between subtractor means and said integrating means, for receiving said electrical pulse signal to extract a pulse-wave component from said first and second difference signals on the basis of said received electrical pulse signal, and for supplying said first and second difference signals thus wave-shaped to said integration means.

9. The apparatus according to claim 8, further comprising:

delay means connected to said multiplier means, for delaying said electrical signal to make a phase of said electrical pulse signal coincident with the phases of said first and second difference signals.

10. The apparatus according to claim 9, wherein said integration means includes first and second integration circuits with different type constants, whereby the temperature-compensation for said bias current is performed prior to the temperature-compensation for said drive pulse amplitude.

11. The apparatus according to claim 1, further comprising:

first detection means connected to said light sensitive means, for receiving said first signal to generate a fourth electrical signal including a signal component during the logic "high" level period of said first signal and a fifth electrical signal including a signal component during logic "low" level.

12. The apparatus according to claim 11, wherein said subtraction means includes:
a subtraction device for detecting differences between said fourth and fifth signals and second signal, to generate, as error signals, a sixth electrical signal representing an error component contained in said logic "high" level, and a seventh electrical signal representing an error component contained in said logical "low" level.

13. The apparatus according to claim 12, wherein said temperature-compensation means comprises:
second detection means for generating first and second mean value signals representing a mean value of said sixth and seventh electrical signals, said first and second mean value signals being inverted and fed back as said first and second feed back signals to said modulator means.

14. The apparatus according to claim 1, wherein said electro-optical converting element includes a semiconductor laser.

15. The apparatus according to claim 14, wherein said modulator means comprises:
current supply means for supplying said d.c. pulse current to said laser; and
current drive means for supplying current pulses corresponding to drive pulse to said laser.

16. The apparatus according to claim 15, wherein said light sensitive means is a photodiode.

17. An apparatus for stabilizing an optical output level of an electro-optical converter, said apparatus comprising:
modulator means for supplying said converter with drive pulses corresponding to an electrical input pulse signal, said modulator means further feeding a d.c. bias current to said converter:
light sensitive means for producing a detection signal indicative of the actual optical output level of said converter;
difference detector means for receiving said detection signal and a reference signal indicative of an ideal optical output level of said converter, and for detecting a difference between integration values of said detection signal and said reference signal to produce an error signal indicative of a change in the actual optical output level of said converter;
waveform-shaping means connected to said difference detector means, for delaying said electrical input pulse signal to produce a delayed pulse signal, and for applying a multiplication operation to said delayed pulse signal and said error signal so as to produce a wave-shaped error signal having a waveform which is reformed to emphasize a pulse component of said error signal; and
temperature-compensation means connected to said waveform-shaping means, for producing first and second feedback signals based on said wave-shaped error signal to feed these feedback signals to said modulator means; said modulator means being respective to said first and second feedback signals to independently modulate said d.c. bias current and the amplitude of said drive pulses applied to said converter, whereby the actual optical output level remains substantially constant.

18. The apparatus according to claim 17, wherein said waveform-shaping means comprises:
delay circuit means connected to said modulator means, for delaying said electrical input pulse signal; and
multiplying circuit means connected to said delay circuit means and said difference detector means, for multiplying said error signal by said delayed pulse signal to produce said wave-shaped error signal.

19. The apparatus according to claim 18, wherein said difference detector means comprises:
first subtraction means for receiving said detection signal and a first reference signal indicative of a first reference logic level of an optical output of said converter, and for detecting a difference between integration values of said detection signal and said first reference signal to produce a first error signal; and
second subtraction means for receiving said detection signal and a second reference signal indicative of a second reference logic level of the optical output of said converter, and for detecting a difference between integration values of said detection signal and said second reference signal to produce a second error signal.

20. The apparatus according to claim 19, wherein said waveform-shaping means comprises:
delay circuit means connected to said modulator means, for delaying said electrical input pulse signal to produce first and second delayed pulse signals having phases respectively coincident with said first and second error signals; and
first multiplying circuit means connected to said delay circuit means and said first subtraction means, for multiplying said first error signal by said first delayed pulse signal to produce a first wave-shaped error signal, said temperature-compensation means producing said first feedback signal based on said first wave-shaped error signal; and
second multiplying circuit means connected to said delay circuit means and said second subtraction means, for multiplying said second error signal by said second delayed pulse signal to produce a second wave-shaped error signal, said temperature-compensation means producing said second feedback signal based on said second wave-shaped error signal.

* * * * *

UNITED STATES PATENT AND TRADEMARK OFFICE
CERTIFICATE OF CORRECTION

PATENT NO. : 4,733,398
DATED : Mar. 22, 1988
INVENTOR(S) : Taro SHIBAGAKI, et al.

It is certified that error appears in the above-identified patent and that said Letters Patent is hereby corrected as shown below:

On the title page

--[73] Assignee: -- should be corrected as follows:

-- Kabushiki Kaisha To_s_hiba, Kawasaki, Japan --

Signed and Sealed this

Twenty-seventh Day of September, 1988

*Attest:*

DONALD J. QUIGG

*Attesting Officer*     *Commissioner of Patents and Trademarks*